US006187648B1

United States Patent
Doi et al.

(10) Patent No.: US 6,187,648 B1
(45) Date of Patent: Feb. 13, 2001

(54) METHOD OF FORMING A DEVICE ISOLATION REGION

(75) Inventors: Tsukasa Doi, Fukuyama; Shigeo Ohnishi, Nara; Katsuji Iguchi, Yamatokoriyama; Naoyuki Shinmura, Tenri, all of (JP)

(73) Assignee: Sharp Kabushiki Kaisha, Osaka (JP)

( * ) Notice: Under 35 U.S.C. 154(b), the term of this patent shall be extended for 0 days.

(21) Appl. No.: 09/270,755

(22) Filed: Mar. 17, 1999

(30) Foreign Application Priority Data

Mar. 24, 1998 (JP) .................................................. 10-075315

(51) Int. Cl.$^7$ ....................................................... H01L 21/76
(52) U.S. Cl. ............................ 438/424; 438/221; 438/296
(58) Field of Search .................................. 438/424, 221, 438/439, 296

(56) References Cited

U.S. PATENT DOCUMENTS

| 5,665,635 | 9/1997 | Kwon et al. ........................ 438/427 |
| 5,786,262 | 7/1998 | Jang et al. . | |
| 5,817,566 | * 6/1998 | Jang et al. ............................ 438/424 |
| 5,858,858 | 1/1999 | Park et al. . | |
| 6,001,706 | * 12/1999 | Tan et al. .............................. 438/424 |
| 6,033,970 | * 3/2000 | Park ..................................... 438/424 |
| 6,037,018 | * 3/2000 | Jang et al. ............................ 438/424 |
| 6,074,903 | * 6/2000 | Rengarajan et al. ................. 438/424 |
| 6,093,618 | * 7/2000 | Chen et al. ........................... 438/424 |

FOREIGN PATENT DOCUMENTS

| 5-47919 | 2/1993 | (JP) . |
| 07074274 | 3/1995 | (JP) . |

* cited by examiner

*Primary Examiner*—Charles Bowers
*Assistant Examiner*—David S Blum
(74) *Attorney, Agent, or Firm*—Nixon & Vanderhye P.C.

(57) ABSTRACT

A method of forming a device isolation region includes the steps of: forming a first dielectric film and an oxidation-resistant deposition film successively on a semiconductor substrate; forming a trench groove in the semiconductor substrate by successively processing the oxidation-resistant deposition film, the first dielectric film and the semiconductor substrate by anisotropic etching; forming a second dielectric film to cover at least an inner surface of the trench groove; depositing a third dielectric film in the trench groove so that the thickness of the third dielectric film buried in the trench groove is larger than a depth of the trench groove; planarizing a surface of the third dielectric film and an upper surface of the trench groove; and removing the oxidation-resistant deposition film and the first dielectric film to form the device isolation region, wherein a thermal treatment of the entire substrate is carried out to densify the third dielectric film and to oxidize an interface between the second dielectric film and the semiconductor substrate.

9 Claims, 2 Drawing Sheets

METHOD OF FORMING A DEVICE ISOLATION REGION

CROSS-REFERENCES TO RELATED APPLICATIONS

This application is related to Japanese patent application No. HEI 10-075315 filedon Mar. 24, 1998 whose priority is claimed under 35 USC §119, the disclosure of which is incorporated herein by reference in its entirety.

BACKGROUND OF THE INVENTION

1. Field of the Invention

The present invention relates to a method of forming a device isolation region, and more particularly to a method of forming a device isolation region by burying a dielectric film in a trench groove.

2. Description of the Related Art

As a structure for achieving electric isolation between devices formed on a semiconductor substrate, there is known a device isolation structure (hereafter referred to as "trench device isolation structure") formed by burying a dielectric film in a trench groove. Such a trench device isolation structure is formed, for example, as shown in FIGS. 2(a) to 2(e).

First, a thermal oxide film 22 made of siliconoxide is formed on a surface of a semiconductor substrate 21. Then, a silicon nitride film 23 is deposited on the thermal oxide film 22 by the chemical vapor deposition (CVD) method (FIG. 2(a)).

A mask is then formed by the photolithography technique, and this mask is used to process the silicon nitride film 23, the thermal oxide film 22 and the semiconductor substrate 21 by anisotropic etching, so as to form a trench groove. Here, a silicon portion on the surface of the trench groove exposed by anisotropic etching has been damaged at an interface to an active region (i.e. the side surface of the trench groove), so that it is not preferable in quality. Therefore, a surface oxide film 24 is formed on the surface of the trench groove to keep good quality (FIG. 2(b)).

Subsequently, a silicon oxide layer 25 is buried in the trench groove by the CVD method utilizing an ozone-TEOS reaction or a high density plasma (FIG. 2 (c)). Then, after densifying the buried silicon oxide layer 25 (for example, in order allow the dielectric film made by the ozone-TEOS reaction to have a film quality similar to the thermal oxide film, it is necessary to carry out a thermal treatment at 1000 to 1100° C. under a nitrogen atmosphere), the surface of the substrate is planarized, for example, by the CMP method (FIG. 2(d)).

Here, if the film quality varies, the bad quality portion will show a large etching rate in a wet etching step carried out several times later. This leads to generation of a concavity at that portion. In order to prevent this concavity generation, the buried silicon oxide layer 25 is densified so that the etching rate of the silicon oxide layer 25 will be approximately equal to that of a thermal oxide film having a good quality.

Further, the silicon oxide film 25 (the silicon oxide film other than the one in the trench groove) and the silicon nitride film 23 on the surface are removed to complete a trench device isolation structure in which the silicon oxide layer is buried in the trench groove (FIG. 2(e)).

However, by burying the silicon oxide layer in the trench groove and conducting a thermal treatment to density the silicon oxide layer, a stress is generated in the semiconductor substrate due to contraction caused by the densification of the buried silicon oxide layer. As a result of this, crystal defects such as sliding and dislocation are generated in crystal lattices in the semiconductor substrate by a thermal treatment step such as thermal oxidation or thermal diffusion of injected impurity ions or the like after the trench groove is formed. This raises a problem that a leak current is generated through the crystal defects to decrease the device isolation efficiency.

SUMMARY OF THE INVENTION

The present invention provides a method of forming a device isolation region, comprising the steps of: forming a first dielectric film and an oxidation-resistant deposition film successively on a semiconductor substrate; forming a trench groove in the semiconductor substrate by successively processing the oxidation-resistant deposition film, the first dielectric film and the semiconductor substrate by anisotropic etching; forming a second dielectric film to cover at least an inner surface of the trench groove; depositing a third dielectric film in the trench groove so that the thickness of the third dielectric film buried in the trench groove is larger than a depth of the trench groove; planarizing a surface of the third dielectric film and an upper surface of the trench groove; and removing the oxidation-resistant deposition film and the first dielectric film to form the device isolation region, wherein (i) a thermal treatment of the entire substrate is carried out to densify the third dielectric film and to simultaneously oxidize an interface between the second dielectric film and the semiconductor substrate before the planarizing step, or (ii) a thermal treatment of the entire substrate is carried out to densify the third dielectric film before the planarizing step, and a further thermal treatment of the entire substrate is carried out to oxidize an interface between the second dielectric film and the semiconductor substrate after the planarizing step.

BRIEF DESCRIPTION OF THE DRAWINGS

The present invention will be better understood from the following detailed description of preferred embodiments of the invention, taken in conjunction with the accompanying drawings, in which.

DETAILED DESCRIPTION OF THE PREFERRED EMBODIMENTS

Hereafter, the present invention will be explained in detail on the basis of the embodiments thereof with reference to the attached drawings.

Figure 1A:
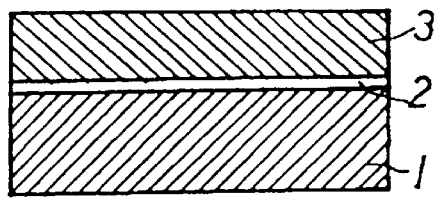
FIGS. 1(a) to 1(e) are views illustrating steps for forming a device isolation region according to the present invention.
Figure 1D:
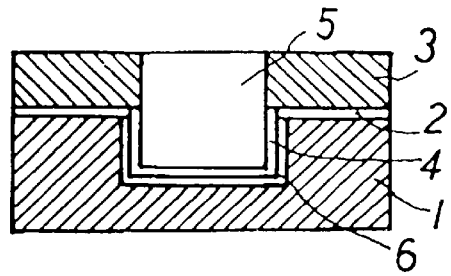
Figure 1B:
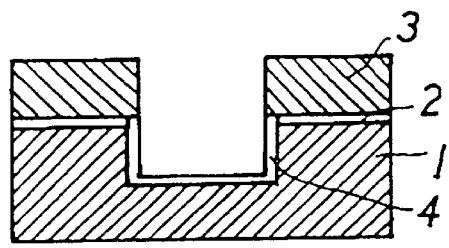
Figure 1E:
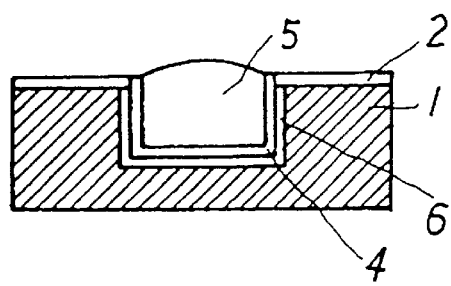
Figure 1C:
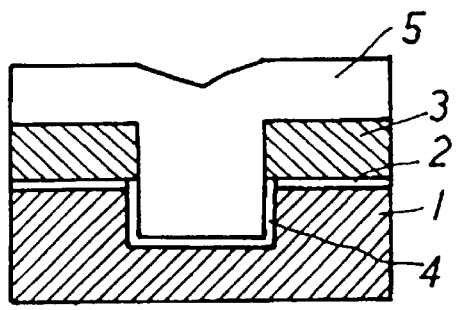
Figure 2A:
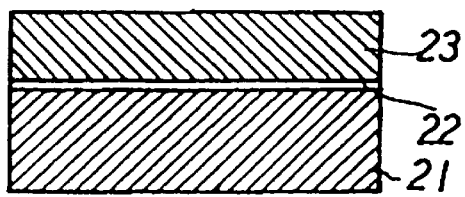
FIGS. 2(a) to 2(e) are view illustrating steps for forming a device isolation region according to the prior art.
Figure 2D:
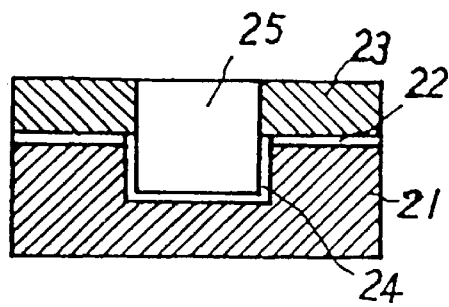
Figure 2B:
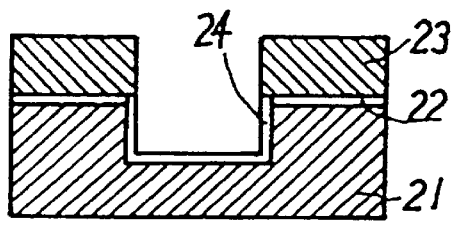
Figure 2E:
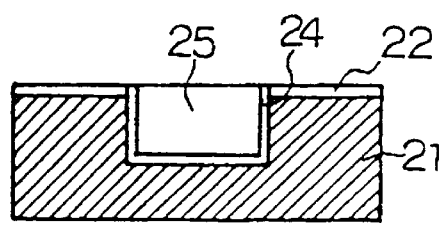
Figure 2C:
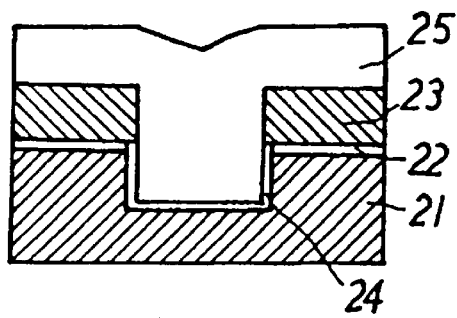

FIGS. 1(a) to 1(e) are views showing steps for forming a device isolation region in a trench device isolation structure according to the present invention. Referring to FIGS. 1(a) to 1(e), a semiconductor substrate 1, a pad oxide film 2 (a first dielectric film), a silicon nitride film 3 (an oxidation-resistant deposition film), a first oxide film 4 (a second dielectric film), a second oxide film 5 (a third dielectric film), and a reoxidation film 6 are shown.

Here, in FIGS. 1(a) to 1(e), the reoxidation film 6 is formed by oxidation of the interface between the semiconductor substrate 1 and the second oxide film 5. However, this is for the purpose of explanation only and, actually, it is difficult to differentiate the interface between the reoxidation film 6 and the second oxide film 5, because both are oxide films. However, since SEM observation of a cross section shows that the interface is moved to the semiconductor substrate side, it seems that the reoxidation film 6 has been formed.

Referring to FIG. 1(*a*), a pad oxide film 2 may be formed to a thickness of 50 to 300 Å (about 140 Å in a 0.25 μm process) on a semiconductor substrate 1. Further, a silicon nitride film 3 may be formed to a thickness of 1000 to 3000 Å (about 1600 Å in the 0.25 μm process) as an oxidation-resistant deposition film over the entire surface of the substrate.

Then, the silicon nitride film 3, the pad oxide film 2 and the semiconductor substrate 1 may be processed by anisotropic etching in an etching step using a mask for forming a trench device isolation region, to form a trench groove to a depth of 1000 to 5000 Å (about 4000 Å in the 0.25 μm process) in a semiconductor substrate.

Then, referring to FIG. 1(*b*), a first oxide film 4 may be formed to a thickness of 30 to 1000 Å (about 400 Å in the 0.25 μm process) on a surface of the trench groove by pyrooxidation or dry oxidation. The first oxide film 4 is formed to ensure interface properties of the buried oxide film (the second oxide film) and to prevent damages to the surface of the semiconductor substrate 1 in later steps.

Subsequently, referring to FIG. 1(*c*), a second oxide film 5 (high density plasma dielectric film or ozone-TEOS dielectric film) may be buried to a thickness of 3000 to 10000 Å (about 7000 Å in the 0.25 μm process) into the trench groove. For example, if the second oxide film 5 is deposited by the plasma CVD method capable of simultaneously performing deposition and sputter etching, the flow rate of silane is set at 30 to 100 SCCM, the flow rate of oxygen is set at 30 to 150 SCCM, the flow rate of argon is set at 20 to 150 SCCM, the microwave power is set at 1000 to 4000 W, the RF power is set at 1000 to 3000 W, the pressure is set at 2 to 100 mTorr, and the deposition rate is set at 4000 to 6000 Å.

This second oxide film 5 preferably has a thickness larger than the depth of the trench groove, more preferably larger than the total thickness of the trench groove, the pad oxide film 2 and the silicon nitride film 3. In other words, it is preferable that the second oxide film 5 is formed so that the surface of the second oxide film 5 buried in the trench groove is positioned at least above the surface of the semiconductor substrate 1. (In FIG. 1(*c*), the surface of the second oxide film 5 is positioned above the surface of the silicon nitride film 3.)

Then, a thermal treatment is carried out for densifying the second oxide film 5. If a high density plasma dielectric film is used as the second dielectric film 5, the thermal treatment is usually carried out at 800 to 1000° C. for 30 to 60 minutes under a nitrogen atmosphere in order to obtain a wet etching rate which is not greater than two times the etching rate of a thermal oxide film. If anozone-TEOS dielectric film is used as the second oxide film 5, the thermal treatment is usually carried out at 1000 to 1100° C. for 30 to 60 minutes, because the ozone-TEOS film has a poorer film quality than the high density plasma dielectric film.

Thereafter, a trench device isolation region may be formed by polishing down to the silicon nitride film 3 by the CMP method, as shown in FIG. 1(*d*).

Then, a stress generated in the semiconductor substrate 1 due to film contraction caused by the densification of the buried second oxide film 5 may be alleviated by reoxidation at 1050 to 1150° C. for 2 to 50 minutes by dry oxidation or pyrooxidation, as shown in FIG. 1(*e*). Through this step, are oxidation film 6 having a thickness of 50 to 1500 Å (about 1200 Å in the 0.25 μm process) may be formed under the first oxide film 4 in the trench groove. This reoxidation can prevent generation of crystal defects such as sliding and dislocation in the crystal lattices in the semiconductor substrate 1 during the later-performed thermal treatment steps such as thermal oxidation and thermal diffusion of injected impurity ions, whereby it is possible to prevent decrease of device isolation efficiency caused by a leak current generated through the crystal defects.

If the thickness of the reoxidation film 6 is smaller than 50 Å, the effect of preventing the film contraction is insufficient. On the other hand, if the thickness of the reoxidation film 6 is larger than 1500 Å, the transistor characteristics are deteriorated. Therefore, the thickness is preferably within the range of 50 to 1500 Å. Finally, the silicon nitride film 3 and the pad oxide film 2 are removed to expose the surface of the semiconductor substrate 1 so as to complete the trench device isolation structure.

In the prior art, a shift in the Raman spectroscopy is +0.77 $cm^{-1}$ in the case of the ozone-TEOS dielectric film, and is +0.49 $cm^{-1}$ in the case of the high-density plasma dielectric film. By applying the present invention, the Raman shift is reduced to +0.02 $cm^{-1}$ in the case of the ozone-TEOS dielectric film, and to +0.01 $cm^{-1}$ in the case of the high-density plasma dielectric film. Thus, according to the present invention, the stress in the silicon substrate can be reduced, and it is possible to prevent generation of crystal defects such as sliding and dislocation in the crystal lattices in the semiconductor substrate during the thermal treatment steps such as thermal oxidation and thermal diffusion of injected impurity ions carried out after the trench-forming step, so that it is possible to prevent decrease of device isolation efficiency caused by a leak current generated through the crystal defects.

Here, in the above embodiment shown in FIGS. 1(*a*) to 1(*e*), the densification step and the reoxidation step are performed separately. However, these two steps may be carried out simultaneously in a single thermal treatment step before the planarizing step. Such a thermal treatment is carried out at 1050 to 1150 ° C. for 2 to 50 minutes.

By forming the reoxidation film, the stress generated in the semiconductor substrate by densification of the third dielectric film can be reduced. Therefore, it is possible to prevent generation of crystal defects such as sliding and dislocation in the crystal lattices in the semiconductor substrate during the thermal treatment steps such as thermal oxidation and thermal diffusion of injected impurity ions carried out after the trench-forming step. As a result, it is possible to prevent decrease of device isolation efficiency caused by a leak current generated through the crystal defects.

Also, the interface properties of the dielectric film buried in the trench groove can be ensured, and the damage to the surface of the semiconductor substrate in the subsequent steps can be prevented.

Further, by depositing the third dielectric film using the high density plasma CVD method, the stress generated in the silicon substrate by densification of the third dielectric film can be further reduced.

Although the present invention has fully been described by way of example with reference to the accompanying drawings, it is to be understood that various changes and modifications will be apparent to those skilled in the art.

Therefore, unless otherwise such changes and modifications depart from the scope of the invention, they should be construed as being included therein.

What we claim is:

1. A method of forming a device isolation region, comprising the steps of:

forming a first dielectric film and an oxidation-resistant deposition film successively on a semiconductor substrate;

forming a trench groove in the semiconductor substrate by successively processing the oxidation-resistant deposition film, the first dielectric film and the semiconductor substrate by anisotropic etching;

forming a second dielectric film to cover at least an inner surface of the trench groove;

depositing a third dielectric film in the trench groove so that the thickness of the third dielectric film is larger than a depth of the trench groove;

planarizing a surface of the third dielectric film and an upper surface of the trench groove;

removing the oxidation-resistant deposition film and the first dielectric film to form the device isolation regions;

thermally treating the entire substrate to densify the third dielectric film before the planarizing step, and further thermally treating in another thermal treatment the entire substrate to oxidize an interface between the second dielectric film and the semiconductor substrate after the planarizing step to form a fourth dielectric film on the inner surface of the trench groove.

2. A method of claim 1, wherein the third dielectric film is deposited by a high-density plasma CVD method that is capable of performing deposition and sputter etching simultaneously.

3. A method of claim 1, wherein the semiconductor substrate is oxidized by a thickness of 50 to 1500 Å from the interface into the semiconductor substrate by the oxidation of the interface between the second dielectric film and the semiconductor substrate.

4. A method of claim 1, wherein the oxidation of the interface between the second dielectric film and the semiconductor substrate is conducted by a thermal treatment at 1050 to 1150 ° C. for 2 to 50 minutes.

5. A method of claim 1, wherein the oxidation of the interface between the second dielectric film and the semiconductor substrate is conducted by pyrooxidation or dry oxidation.

6. A method of claim 1, wherein the first to third dielectric films are silicon oxide films.

7. A method of claim 1, wherein the third dielectric film is formed by a CVD method using ozone-TEOS as a material.

8. A method of claim 1, wherein the oxidation-resistant deposition film is a silicon nitride film.

9. A method of manufacturing a device isolation region in a semiconductor product, the method comprising the steps of:

providing a first dielectric film and an oxidation resistant film on a semiconductor substrate;

forming a trench groove in the semiconductor substrate by processing the oxidation resistant film, the first dielectric film, and the semiconductor substrate;

forming a second dielectric film covering at least an inner surface of the trench groove;

forming a third dielectric film in the trench groove so that a thickness of the third dielectric film is larger than a depth of the trench groove;

thermally treating the substrate including the third dielectric film in order to densify the third dielectric film;

after said thermally treating step, planarizing a surface of the third dielectric film; and after said planarizing step, carrying out another thermally treating step for thermally treating the substrate in order to oxidize an interface between the second dielectric film and the semiconductor substrate in the trench groove.

* * * * *